US008528202B2

(12) United States Patent
Yumoto

(10) Patent No.: US 8,528,202 B2
(45) Date of Patent: Sep. 10, 2013

(54) METHOD FOR MANUFACTURING A THREE DIMENSIONAL CIRCUIT BOARD

(75) Inventor: Tetsuo Yumoto, Tokyo (JP)

(73) Assignee: Sankyo Kasei Co., Ltd., Tokyo (JP)

( * ) Notice: Subject to any disclaimer, the term of this patent is extended or adjusted under 35 U.S.C. 154(b) by 1426 days.

(21) Appl. No.: 11/513,478

(22) PCT Filed: Feb. 17, 2005

(86) PCT No.: PCT/JP2005/002483
§ 371 (c)(1),
(2), (4) Date: Mar. 22, 2010

(87) PCT Pub. No.: WO2005/086548
PCT Pub. Date: Sep. 15, 2005

(65) Prior Publication Data
US 2007/0200554 A1    Aug. 30, 2007

(30) Foreign Application Priority Data

Mar. 4, 2004 (JP) ................................. 2004-061150

(51) Int. Cl.
*H05K 3/42* (2006.01)
(52) U.S. Cl.
USPC .................. 29/852; 29/846; 29/858; 29/848; 29/849
(58) Field of Classification Search
USPC .................. 29/858, 848, 856, 883, 846, 852, 29/832, 831; 324/158.1, 763.01, 351, 355; 438/629, 637, 638, 639, 640, 667, 668; 430/318, 313, 319; 257/701, 276, 414
See application file for complete search history.

(56) References Cited

U.S. PATENT DOCUMENTS

| 4,017,968 A | * | 4/1977 | Weglin | 29/853 |
| 4,424,095 A | | 1/1984 | Frisch et al. | |
| 4,604,799 A | * | 8/1986 | Gurol | 29/847 |
| 4,812,275 A | * | 3/1989 | Yumoto | 264/129 |
| 4,935,284 A | | 6/1990 | Puerner | |
| 5,015,519 A | | 5/1991 | Yumoto | |
| 6,114,240 A | * | 9/2000 | Akram et al. | 438/667 |
| 2001/0002625 A1 | | 6/2001 | Fujii et al. | |
| 2005/0127478 A1 | * | 6/2005 | Hiatt et al. | 257/621 |

FOREIGN PATENT DOCUMENTS

| JP | 61-239694 | 10/1986 |
| JP | 63-128181 | 5/1988 |
| JP | 4-44293 | 2/1992 |
| JP | 4-134869 | 2/1992 |
| JP | 6-216488 | 8/1994 |
| JP | 11-97809 | 4/1999 |
| JP | 2002-171048 | 6/2002 |

* cited by examiner

*Primary Examiner* — Peter DungBa Vo
*Assistant Examiner* — Kaying Kue
(74) *Attorney, Agent, or Firm* — Jordan and Hamburg LLP

(57) ABSTRACT

A molding pin for a metal die is prevented from breaking, solder is surely deposited, and thus, a circuit pitch can be reduced to the limit. On the front plane of a circuit board, prescribed circuit patterns made of a conductive material are formed, and on the rear plane, prescribed circuit patterns are also formed. On the circuit board, a through hole is formed to carry electricity between the circuit patterns on both planes. The inner shape of the through hole is narrow in a direction between the adjacent circuit patterns and wide in a circuit extending direction.

6 Claims, 5 Drawing Sheets

(A)　　　(B)

(C)　　　(D)

(E)　　　(F)

METHOD FOR MANUFACTURING A THREE DIMENSIONAL CIRCUIT BOARD

TECHNICAL FIELD

The present invention relates to a method for manufacturing a solid or three-dimensional circuit board.

BACKGROUND ART

In recent years, demands for making much narrower intervals or pitches between circuit patterns on a circuit board increase to make electronic devices much smaller and to save resources and energy for their manufacturing. Accordingly, circuit patterns are formed on the both sides of a circuit board, which are electrically connected by a through hole of a conductive layer. Although the through hole is conventionally formed by drilling, recently it is formed during the injection-molding process for the circuit board itself (Patent Documents 1, 2, and 3).

Patent Document 1: JP unexamined patent application publication No. 61-239694
Patent Document 2: JP unexamined patent application publication No. 63-128181
Patent Document 3: U.S. Pat. No. 4,424,095

Structure of a conventional solid or three-dimensional circuit board 11 will be described with reference to FIGS. 5 to 7. A circuit board 21 is provided with circuit patterns 31, 41 on the both sides thereof, and the circuit patterns are electrically connected by through holes 51. The diameter of the through hole is in several-ten-micron order. The circuit board having those through holes is formed by injection molding with a molding die having a circular-cylindrical pin implanted. The diameter of the through hole is several-ten-micron order, i.e. 30 to 50 microns. The shape of the through hole 51 is cylindrical and has the same diameter in any points of its longitudinal direction. Ratio of the thickness of the circuit board 21 to the internal diameter of the through hole 51 or aspect ratio is limited to about five to one (5:1). Namely, if the aspect ratio falls within 5:1, electroless plating can deposit, however, if the aspect ratio exceeds 5:1, deposit by electroless plating is either difficult or impossible.

DISCLOSURE OF THE INVENTION

Problem to be Solved by the Invention

In order to make much narrower intervals or pitches between the circuit patterns for making electronic devices much smaller, the diameter of the through hole 51 has to be small in several-micron order, and consequently and the aspect ratio has to be high. When the aspect ratio is high, a pin or projection in the injection molding die for forming the through hole cannot withstand the flow pressure of a liquid resin in the injection molding process, causing damages on the molding pin frequently. Further, when the aspect ratio is high, deposit by electroless plating is either difficult or impossible.

An object of the present invention is to provide a method for manufacturing a solid or three-dimensional circuit board, which can prevent the damage of a molding pin or projection in a molding die for forming a through hole of the circuit board, which can make electroless plating to provide secure deposit, and which can make the pitch or interval between the circuit patterns narrow to the limit.

Means for Solving the Problem

The first feature of the present invention is a method for manufacturing a solid or three-dimensional circuit board comprising the steps of molding a through hole onto a primary molded article of insulating material in a injection molding process with using a molding pin or projection; molding a predetermined circuit pattern of conductive material on the both sides of a circuit board constituted of the primary molded article in a plating process; forming a conductive layer over the through hole, which electrically connects the circuit patterns on the both sides the circuit board. And in the method, the width of the through hole in the circuit-extended direction is larger than the width of the through hole in the circuit-pattern-lined direction. Namely, the openings of the through hole exposed in the circuit pattern are formed in a shape such that its width in the circuit-extended direction is larger than that in the circuit-pattern-lined direction, such as rectangular, elliptic, or the like.

The second feature of the present invention is a method for manufacturing a solid or three-dimensional circuit board according to the first feature thereof, wherein the cross-section of the through hole cut with a plane along the direction of the thickness of the circuit board is a tapered shape. "Tapered shape" includes a shape widening or broadening toward the end both in the circuit-pattern-lined direction and in the circuit-extended direction and a shape widening or broadening toward the end either in the circuit-pattern-lined direction or in the circuit-extended direction.

The third feature of the present invention is a method for manufacturing a solid or three-dimensional circuit board according to either the first or the second feature thereof, wherein a barrier is formed between the adjacent circuit patterns. When lead wire terminals are mounted onto the circuit patterns by soldering, as the pitches or intervals between the circuit patterns are extremely narrow, solder will splash, causing short-circuit between the adjacent circuit patterns. The barrier is formed to prevent such solder-splash.

The fourth feature of the present invention is a method for manufacturing a solid or three-dimensional circuit board according to any of the first to the third features thereof, wherein the through hole is a blind through hole obtained by closing the through hole by plating.

Effect of the Invention

As the present invention effectively prevents the damage of a molding die, particularly damage of a molding pin or projection, and provides a reliable deposit in plating, the pitches or intervals between the adjacent circuit patterns on a solid or three-dimensional circuit board is cut down to the limit. Further, as the splash of solder is prevented, short-circuits between the adjacent circuits are avoided. Furthermore, as the blind through hole eliminates the step of cleaning flux in the process for mounting a circuit by soldering and prevents the outflow of solder, reliability of solid or three-dimensional circuit is enhanced.

EXPLANATION OF REFERENCE NUMERALS

Figure 1:
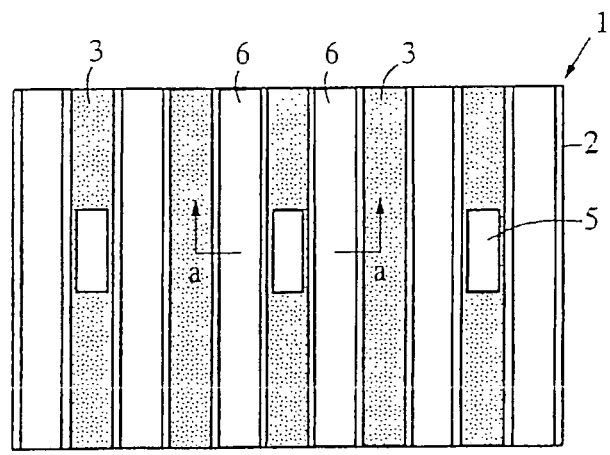
FIG. 1 is a plan view of a circuit board.

1 Solid/three dimensional circuit board
2 Circuit board
3 Circuit pattern
4 Circuit pattern
5 Through hole
6 Barrier
20 Primary molded article
30 Circuit pattern
40 Circuit pattern

BEST MODE FOR CARRYING OUT THE INVENTION

A structure of a solid or three dimensional circuit board 1 according to the present invention will be described below with reference to FIGS. 1 to 3. A circuit board 2 is made of a primary molded article of an insulating material and is plated. One side of the circuit board 2 is provided with a pre-determined circuit patterns 3, 3, . . . of a conductive material as shown in FIG. 1. The other side of the circuit board 2 is provided with a pre-determined circuit patterns 4, 4, . . . of a conductive material as shown in FIG. 3. Through hole 5, 5, . . . of conductive layer 5a are formed on the circuit board 2, which electrically connect the circuit patterns 3, 3, . . . and 4, 4, . . . as shown in FIG. 2.

The through hole 5 is shaped such that its width in the circuit-extended direction is larger than that in the circuit-pattern 3, 3-lined direction. The circuit-pattern 3, 3-lined direction means that a direction along which the circuit patterns 3, 3, . . . are lined up. For example, in FIG. 1, the through hole 5 is shaped in a rectangle with its left and right sides longer than its upper and lower sides. Such a rectangular shape is not only applied to the upper-end opening 5b of the through hole 5 but also applied to all through from there to the lower-end opening 5c thereof as shown in FIGS. 2, 3. Namely, the width of the through hole 5 in the circuit-extended direction is larger than that in the circuit-pattern 4, 4-lined direction. In FIG. 3, the through hole 5 is shaped in a rectangle with its left and right sides longer than its upper and lower sides. However, the through hole 5 is not limited to a rectangular shape, and it may be a elliptical shape with its major axis along the circuit-extended direction. Therefore, as the shape of the through hole 5 is as such, the molding pin in a injection molding die for forming the through hole 5 is able to have a larger diameter than the conventional pin, and the risk of damaging the pin considerably decrease.

Figure 2:
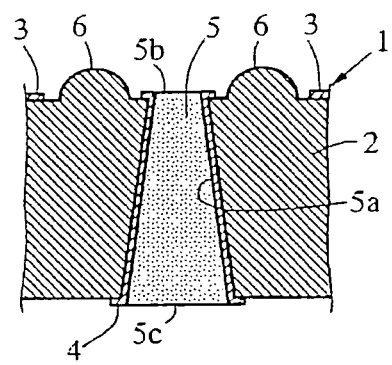
FIG. 2 is an enlarged sectional view taken along the line a-a in FIG. 1.
Figure 3:
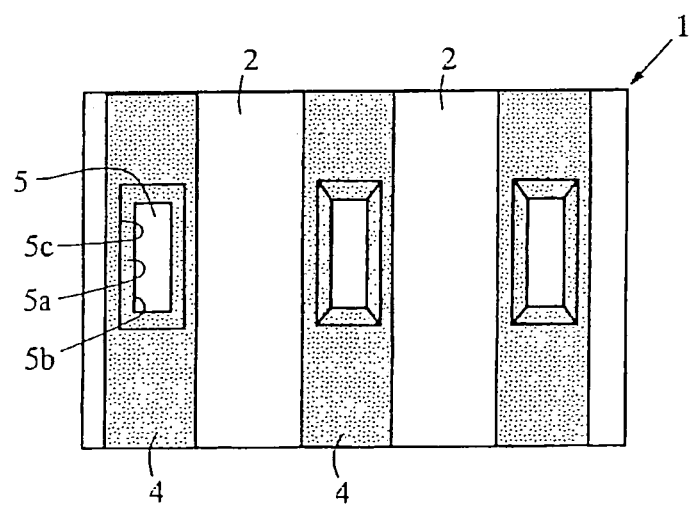
FIG. 3 is a bottom view of a circuit board.

The cross-section of the through hole 5 cut with a plane along the direction of the thickness of the circuit board 2 is, as shown in FIG. 2, a tapered shape widening toward the end from the upper-end opening 5b to the lower-end opening 5c. As apparent in comparison between FIG. 1 and FIG. 3, the size of the lower-end opening 5c is about twice larger than that of the upper-end opening 5b. The width of the circuit pattern 4 on the lower side of the circuit board 2 is about twice larger than that of the circuit pattern 3 on the upper side thereof, too. "Tapered shape" means, as shown in FIG. 2, that the through hole 5 widens or broadens toward the end not only in the direction along which the circuit patterns 3, 3, 4, 4 are lined up, but also in the direction along which the circuit patterns 3, 4 are extended. Namely, the through hole 5 widens or broadens toward the end not only in the lateral direction of FIGS. 1, 3 but also in the longitudinal direction of FIGS. 1, 3. However, it dose not mean that the through hole 5 has to widen or broaden toward the end in the both directions. The through hole 5 may widen or broaden toward the end either in the circuit-pattern 3, 3, 4, 4-lined direction or in the circuit-pattern 3, 4-extended direction.

By adopting the tapered through hole 5, even though an apparent aspect ratio is about 1:10, the substantial aspect ratio is limited to 1:5. Thereby, catalyst solution or an electroless solution is smoothly circulated in the through hole to ensure catalyst-deposit and plating-deposit. As the molding pin in an injection-molding die for forming the through hole 5 is formed in a trapezoidal section shape, risk of damaging the molding pin reduces considerably.

Further, recently, the circuit patterns 3, 4 are formed such that the pitch or interval between the adjacent circuit patterns is extremely narrow to the limit. Therefore, when lead line terminals are mounted onto the circuit patterns by soldering, solder will splash, causing short-circuits between the adjacent circuit patterns 3, 3. In order to prevent such solder-splash, a barrier 6 is formed between the adjacent circuit patterns.

Figure 11:
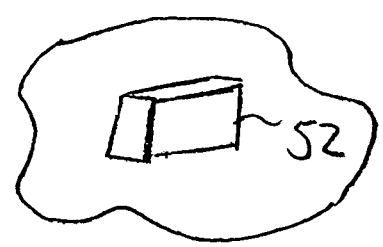
FIG. 11 is a planar top view of a molding pin of a molding die used in an injection molding process.

Steps in manufacturing a solid/three dimensional circuit board according to the present invention is described below with reference to FIGS. 4(A)-(F). FIG. 4(A) shows a primary molded article 20, which is molded by injecting a plating-grade liquid-crystal polymer into a closed molding die. The outer shape of the primary molded article 20 is matched with the circuit board 2 serving as a final product. The through hole 5 is formed on the primary molded article 20 by a molding pin 52 (see FIG. 11) in the injection molding process. Aromatic polyester is used as the liquid crystal polymer.

Figure 4:
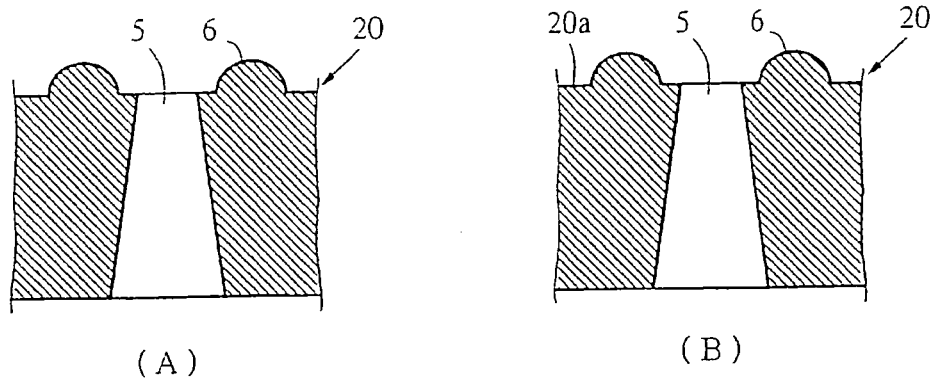
FIGS. 4(A) to 4(F) are sectional views showing manufacturing steps.
Figure 4:
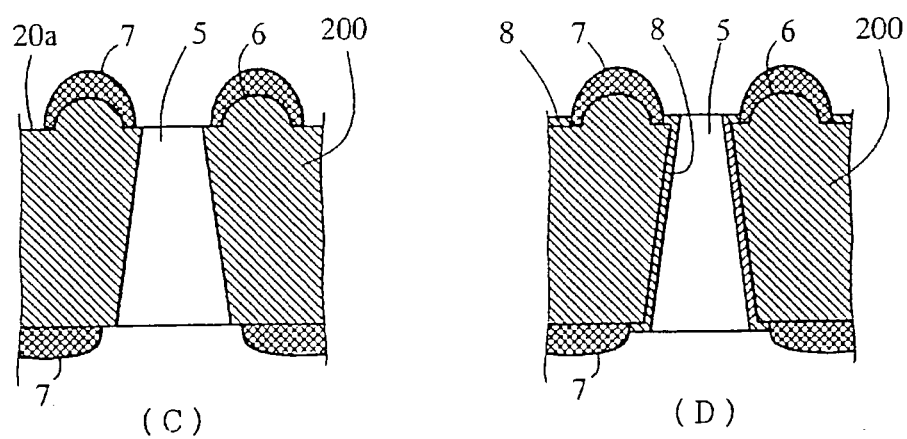
Figure 4:
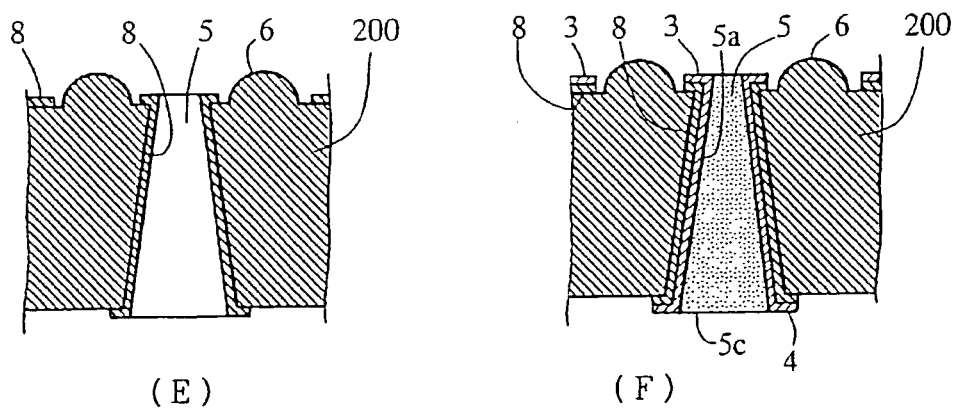
Figure 5:
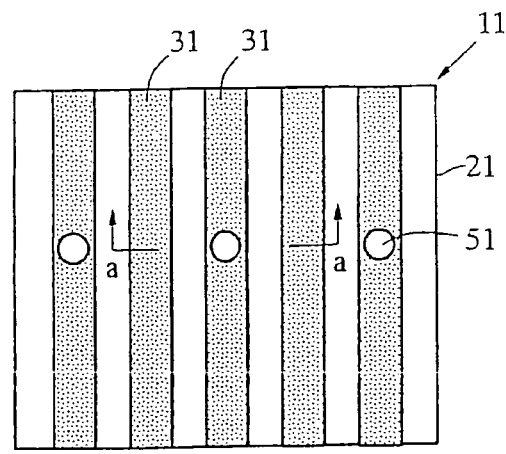
FIG. 5 is a plan view of a conventional example.
Figure 6:
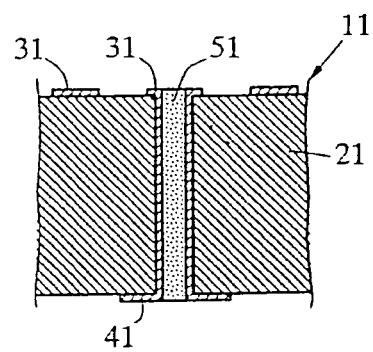
FIG. 6 is a sectional view taken along the line a-a in FIG. 5.
Figure 7:
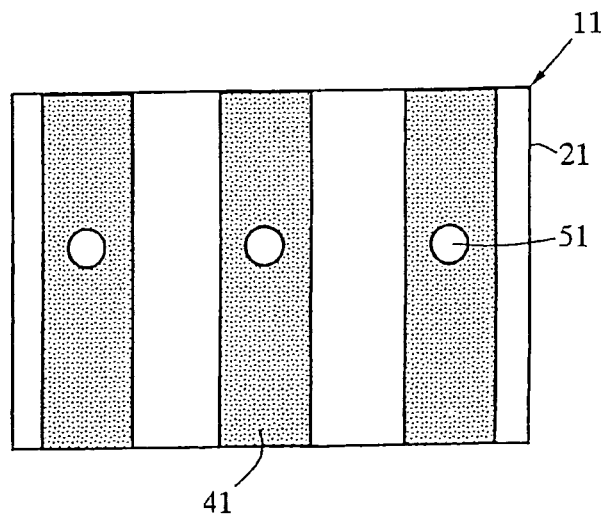
FIG. 7 is a bottom view of a conventional example.

The primary molded article 20 is subjected to a plating process. However, before the plating process, the upper side of the primary molded article 20 is first chemically etched to form a coarsened surface 20a as shown in FIG. 4 (B) The etching process is performed as follows. An alkaline aqueous solution is obtained by solving sodium hydroxide or potassium hydroxide in water at a pre-determined concentration and is heated to a pre-determined temperature. The primary molded article 20 is dipped in the alkaline aqueous solution for a pre-determined period of time.

Thereafter, the primary molded article 20 is inserted into another molding die, whose cavity is shaped such that a pre-determined gap is made between its inner surface and the primary molded article 20 when the primary molded article 20 is inserted. After closing the molding die, oxyalkylene-group-containing polyvinyl alcohol resin such as "ECO-MATY AX", a product of Nippon Synthetic Chemical Industry Co., Ltd., is injected into the molding die for masking the primary molded article 20. Thereby, a secondary molded article 200 having a mask 7 on the pre-determined portion of the upper side thereof is formed as shown in FIG. 4(C).

Next, a catalyst 8 consisting of palladium or gold is applied onto a coarsened surface 20a of the secondary molded article 200 as shown in FIG. 4(D). The catalyst application may be conducted by publicly known methods such that palladium is deposited on the surface of the secondary molded article 200 by dipping it in a silver- and palladium-based mixed catalyst solution and by activating it with acid such as hydrochloric acid or sulfuric acid. Another method is that a relatively strong reducer such as stannous chloride is adsorbed on the surface of the secondary molded article 200 and then it is dipped in a catalyst solution containing noble metal ions such as gold ions. In this process, as the through hole 5 is tapered as described above, the catalyst solution is smoothly circulated to reliably deposit gold on the surface.

Next, the secondary molded article 200 is heated in hot water and the mask 7 molded by secondary molding is solved into the hot water as shown in FIG. 4(E). Namely, when the secondary molded article 200 is put in hot water at 80° C. for 10 minutes, "ECOMATY AX" completely solves in the hot water.

Then, the circuit patterns 3, 4 are formed on the catalyst-applied portion of the secondary molded article 200 by plating, as shown in FIG. 4(F). In this step, as an electroless solution smoothly circulates and flows in the through hole due to its tapered shape as described before, plating can be securely formed. For plating, either chemical copper plating, chemical nickel plating, or the like is used.

Finally, heat treatment is performed to remove moisture in the secondary molded article 200 to finish the step of forming a conductive circuit, thereby the solid/three dimensional circuit board 1 is completed.

In the above embodiment, however, disadvantage is observed in a case such that an electronic element is mounted on the circuit pattern 3 of the one side of the circuit board 2 by soldering and the circuit pattern 4 of the opposite side thereof is used as an electric contact. Either flux or solder passes from the one side of the circuit board 2 through the through hole 5 and flows onto the circuit pattern 4 of the opposite side thereof, thereby damaging the function of circuit pattern 4 as an electric contact.

Figure 8:
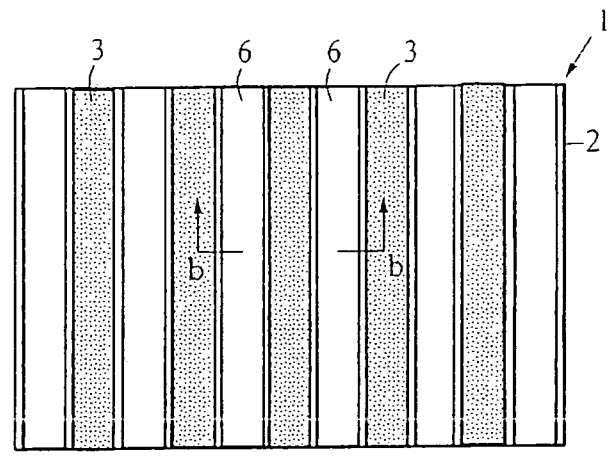
FIG. 8 is a plan view showing another embodiment.
Figure 9:
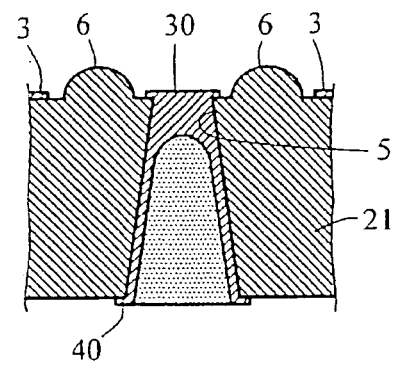
FIG. 9 is a sectional view taken along the line b-b in FIG. 8.
Figure 10:
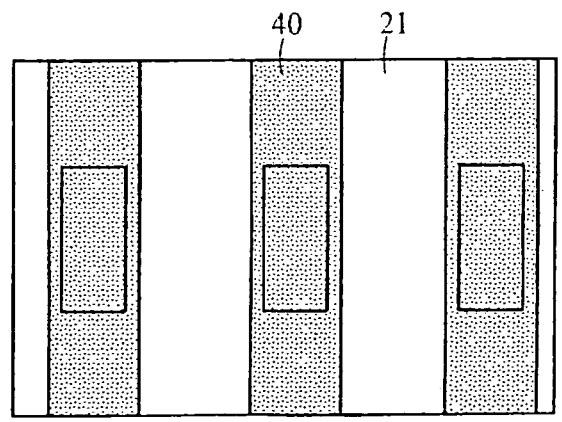
FIG. 10 is a bottom view in another embodiment.

Therefore, another embodiment will be described below with reference to FIGS. 8 to 10. The through hole 5 is closed with a plating metal 30 and the interior of the plating metal 30 is formed in a cone-shaped hollow. The lower end of the plating metal 30 serves as a circuit pattern 40 on the lower side of circuit board 21. The rest of the configuration of this embodiment is the same as that of the previous embodiment, and accordingly the same reference numerals are applied. In this embodiment, the step of cleaning flux in the process for mounting a circuit by soldering is eliminated and an outflow of solder is prevented. Therefore, reliability of the solid/three dimensional circuit is improved.

INDUSTRIAL APPLICABILITY

The present invention is applied to such a example as a connector which electrically connects, via a coaxial cable, the electric circuit portion and liquid crystal display portion of a portable cellular phone, both of which are pivotally jointed together.

The invention claimed is:

1. A method for manufacturing a three-dimensional circuit board, comprising the steps of:

forming a through hole onto a primary molded article of insulating material with a molding pin or projection during an injection molding process;

forming predetermined circuit patterns of a conductive material, respectively, on both sides of a circuit board constituted of the primary molded article in a plating process, wherein at a given side of the circuit board the predetermined circuit patterns are lined up with each one of said given side predetermined circuit patterns extending in a first direction; and forming a conductive layer over the through hole, which electrically connects the respectively formed predetermined circuit patterns on the both sides of the circuit board;

wherein said through hole is polygonal and tapered in a direction extending from one side to another side of said both sides, wherein for every depth level of the through hole from one side to said another side of the circuit board, a planar area of the polygonal through hole at each one depth level has a first dimension larger than a second dimension orthogonal to the first dimension;

wherein at said given side of said both sides of the circuit board, a shape of the through hole has said first dimension in said first direction that is larger than said second dimension along said given side, said second dimension being orthogonal to the first dimension.

2. A method for manufacturing a three-dimensional circuit board according to claim 1, wherein a barrier is formed between adjacent circuit patterns within said respectively formed predetermined circuit pattern formed on said given side, said circuit board having a thickness at said barrier greater than at an edge of said through hole adjacent said barrier for preventing solder splash during said forming predetermined circuit patterns.

3. A method for manufacturing a three-dimensional circuit board according to claim 1, wherein the through hole is blinded by closing the through hole by plating.

4. A method for manufacturing a three-dimensional circuit board according to claim 1, wherein a barrier is formed between adjacent circuit patterns within said respectively formed predetermined circuit pattern formed on a first side of said both sides.

5. A method for manufacturing a three-dimensional circuit board according to claim 2, wherein the through hole is blinded by closing the through hole by plating.

6. A method for manufacturing a three-dimensional circuit board according to claim 1, wherein a barrier is formed between adjacent circuit patterns within said respectively formed predetermined circuit pattern formed on said given side, said barrier comprising a region of greater elevation relative to adjacent regions to each side of the barrier on the given side.

* * * * *